(12) United States Patent
Tsai et al.

(10) Patent No.: US 6,255,162 B1
(45) Date of Patent: Jul. 3, 2001

(54) METHOD OF GAP FILLING

(75) Inventors: Yu-Tai Tsai, Taichung Hsien; Huang-Hui Wu, Changhua Hsien; Chien-Chung Huang, Taichung Hsien; Yeong-Chih Lai, Nantou, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/270,405

(22) Filed: Mar. 16, 1999

(51) Int. Cl.⁷ .............................................. H01L 21/8247
(52) U.S. Cl. ...................... 438/257; 438/264; 438/766; 438/763
(58) Field of Search .................... 438/766, 264, 438/764, 286, 763, 257, 35, 51, 48, 47, 203, 302, 305; 257/301, 655, 351, 344

(56) References Cited

U.S. PATENT DOCUMENTS

| | | | |
|---|---|---|---|
| 5,112,762 | * 5/1992 | Anderson et al. | 437/35 |
| 5,177,027 | * 1/1993 | Lowrey et al. | 437/41 |
| 5,216,265 | * 6/1993 | Anderson et al. | 257/301 |
| 5,252,506 | * 10/1993 | Carter et al. | 437/47 |
| 5,315,144 | * 5/1994 | Cherne | 257/351 |
| 5,401,982 | * 3/1995 | King et al. | 257/59 |
| 5,459,085 | * 10/1995 | Pasen et al. | 437/35 |
| 5,712,814 | * 1/1998 | Fratin et al. | 365/182 |
| 5,874,329 | * 2/1999 | Neary et al. | 438/203 |
| 5,920,776 | * 7/1999 | Fratin et al. | 438/257 |
| 5,936,285 | * 8/1999 | Pasch et al. | 257/368 |
| 6,127,222 | * 10/2000 | Luning et al. | 438/257 |
| 6,174,758 | * 1/2001 | Nachumovsky | 438/199 |

* cited by examiner

*Primary Examiner*—Charles Bowers
*Assistant Examiner*—Laura M Schilly

(57) ABSTRACT

A method of gap filling is provided. A substrate comprising conductive structures thereon is provided. A gap is between the conductive structures. A conformal first dielectric layer is formed on the substrate and is used to protect the conductive structures and the substrate. An implanting process is performed with a high angle to implant impurities into the first dielectric layer. A second dielectric layer is formed on the implanted first dielectric layer to fully fill the gap.

16 Claims, 3 Drawing Sheets

METHOD OF GAP FILLING

BACKGROUND OF THE INVENTION

1. Field of the Invention

The invention relates to a method of a multi-step high density plasma (HDP) chemical vapor deposition (CVD), and more particularly to a method of filling a gap between conductive structures in a semiconductor device with dielectric material.

2. Description of the Related Art

In a semiconductor device, multilevel conductive wiring and other conductors are normally isolated by inter-metal dielectric (IMD) layers. As the dimension of device shrinks, the aspect ratio of the gap between conductive layers increases. The gap with a higher aspect ratio is more difficult to fill. On the other hand, as the distance between conductive layers and other conductors becomes shorter, the capacitance increases, so that the operating speed is limited. To achieve a higher efficiency with the shrinking dimension of devices, the dielectric layer between conductive layers are required to have characteristics such as being filled within the gap evenly and uniformly, preventing the water flow, and minimizing the capacitance between conductive layers by using a low dielectric constant material.

Thus, it is important to deposit a high quality, interstice-free dielectric layer to fill a gap with a high aspect ratio. The dielectric layer is formed, for example, by CVD which is performed by introducing the precursor to the deposition surface, and after reaction, the material is deposited on the surface. Different kinds of CVD processes are in use, such as atmospheric pressure CVD (APCVD), low pressure CVD (LPCVD), and plasma enhanced CVD (PECVD). To obtain high quality oxide by APCVD and LPCVD, a high deposition temperature such as about 650° C. to 850° C. is required. However, for some conductive material, for example, aluminum, such a high deposition temperature causes voids within oxide. Structures like voids absorb water, and thus, are not a proper IMD layer. By PECVD, plasma provides extra energy for reacting gases, and therefore, the deposition is performed at a low temperature, for example, about 400° C. or lower.

In a conventional method of forming a dielectric layer between conductive wiring, an interlayer is formed by PECVD using silane or tetra-ethyl-ortho-silicate (TEOS) as precursor. An accompanying spin-on-glass (SOG) layer is formed on the conductive wiring and to fill the gap which is between the conductive wiring. However, due to the characteristics of absorbing water and the formation of interstices, SOG layer cannot fill the gap completely. This phenomenon is even more obvious as the devices become smaller. Thus, a method for filling the gap with a high quality dielectric material is developed.

In addition, in a device with a smaller dimension, the conventional CVD cannot fill a gap with a higher aspect ratio completely. For example, using PECVD, interstices between conductive wiring are sealed by the deposited material. In the subsequent process, the interstices are open and contaminated. Therefore, the conductive wiring or the contact are damaged, and the device is degraded.

FIGS. 1A and 1B show a method of filling a gap by a conventional PECVD process. In FIG. 1A, an oxide layer 10 is formed on a substrate 12 by PECVD with TEOS as a precursor. On an upper part of the side wall of the conductive wiring 14, an overhang 15 is formed. As the deposition continues, an interstice 16 is sealed as shown in FIG. 2. The interstice 16 is formed as a seam along the conductive wiring lengthwisely. The seam is near the end of the conductive wiring, or is restricted in the bending part of the conductive wiring. In the subsequent process, the interstice 16 is very likely to be uncovered, so that chemical for polishing or the by-product for etching is trapped by the interstice. Removing the trapped material within the interstice is very difficult. Thus, the yield of the subsequent process is degraded.

SUMMARY OF THE INVENTION

The invention provides a method of gap filling. A substrate comprising conductive structures thereon is provided. A gap is located between the conductive structures. A conformal first dielectric layer is formed on the substrate and is used to protect the conductive structures and the substrate. An implanting process is performed with a high angle to implant impurities into the first dielectric layer. A second dielectric layer is formed on the implanted first dielectric layer to fully fill the gap.

The invention performs the high-angle implanting process on the first dielectric layer so that a part of the first dielectric layer positioned above the conductive structures is transnatured. The remaining part of the first dielectric layer is not affected. The transnatured first dielectric layer and the original first dielectric layer have different deposition rates for depositing a dielectric material thereon. The second dielectric layer deposited on the original first dielectric layer is faster than the second dielectric layer deposited on the transnatured first dielectric layer. Overhangs are not formed on an upper part of the side wall of each the conductive structures so that voids are not formed in the second dielectric layer between the conductive structures.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
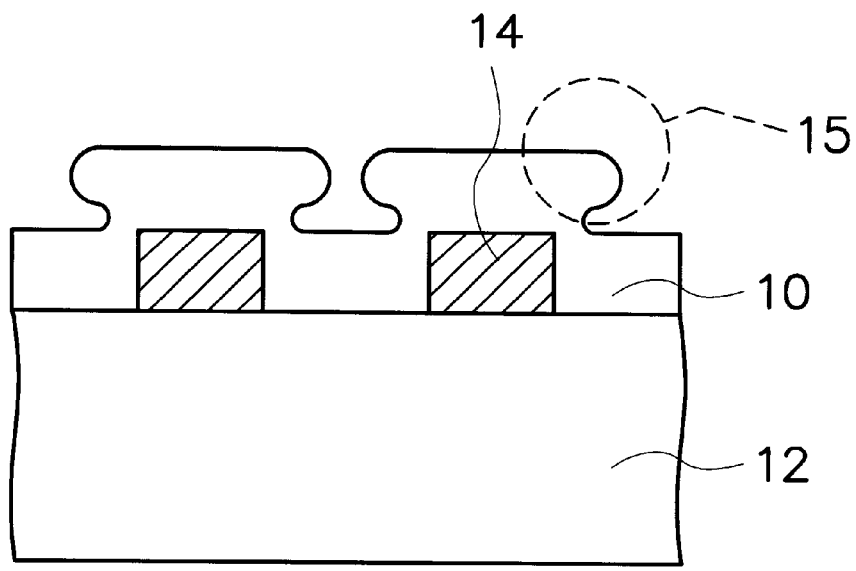
FIGS. 1A and 1B are schematic, cross sectional views of gap filling by a conventional PECVD.
Figure 1B:
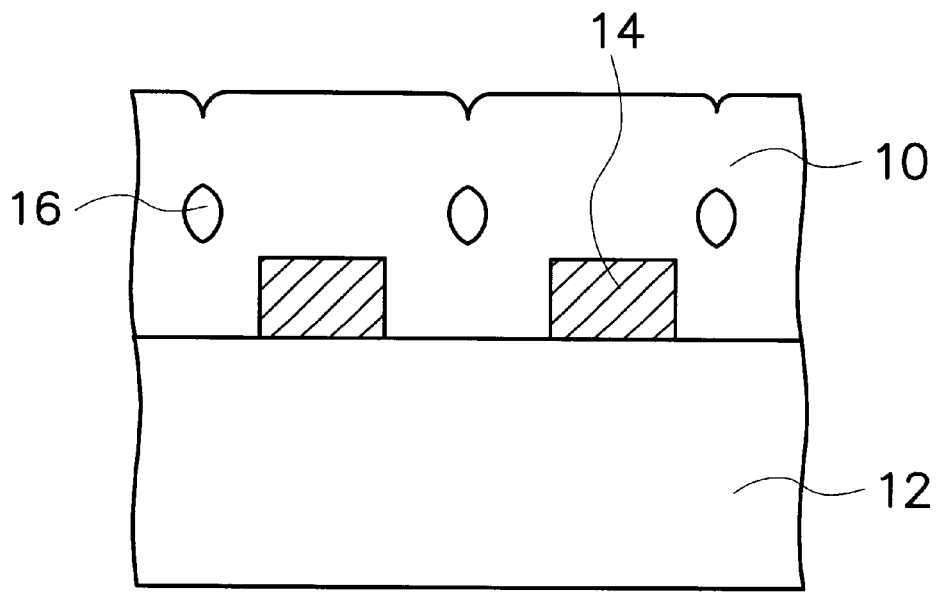
Figure 2A:
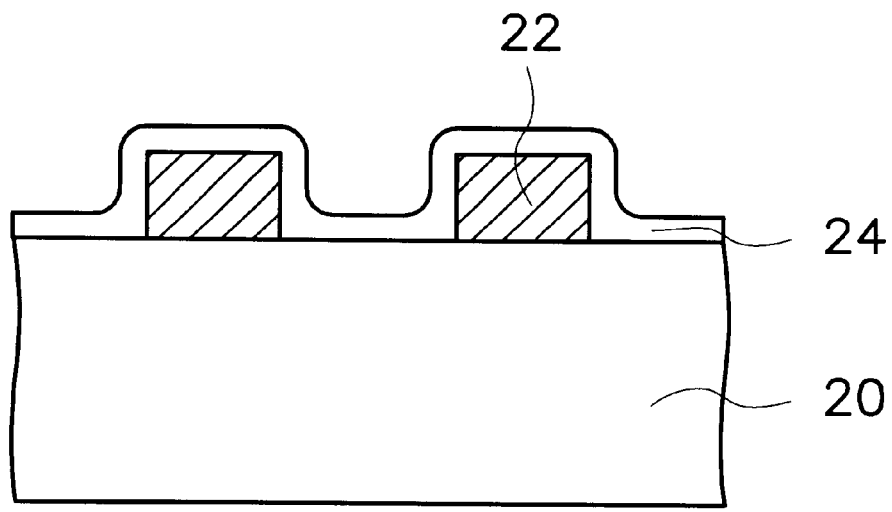
FIGS. 2A to 2D are schematic, cross-sectional views showing the process steps of one preferred embodiment of the method of gap filing.

As shown in FIG. 2A, on a provided semiconductor 20, conductive structures 22 are formed. The conductive structures 22 can be formed by different kind of material, including aluminum, alloy of aluminum and silicon, alloy of aluminum and copper, copper, alloy comprising copper and other multi-layer structures, and other multi-layer structures comprising cheaper metal such as metal with high melting point. The substrate may comprise different kinds of structures, such as a transistor, a diode, conventional semiconductor devices, or other interconnect metal layer.

A conformal first dielectric layer 24 is formed over the substrate 20 to cover the conductive structures 22. The material of the first dielectric layer 24 comprises undoped silicon dioxide. The method for forming the first dielectric layer 24 may be atmospheric pressure chemical vapor deposition (APCVD) or plasma enhanced chemical vapor deposition (PECVD).

Figure 2B:
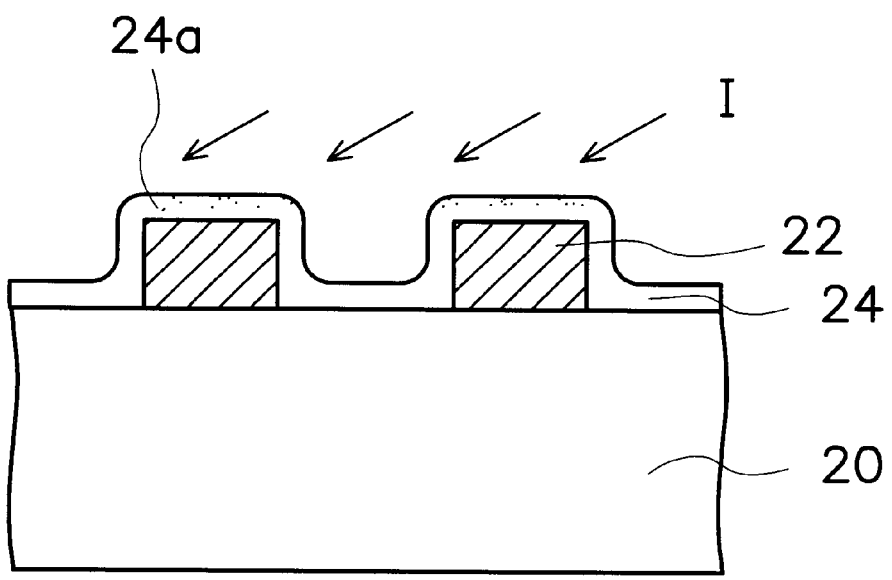

As shown in FIG. 2B, an implanting process is performed on a part of the first dielectric layer 24 positioned above the conductive structures 22. Impurities are implanted with a high angle of about 40–80 degrees. The preferred implanting angle is about 70 degrees. A gas source used in the implanting process comprises nitrogen ($N_2$) or ammonia ($NH_3$). The implanted impurities make the first dielectric layer 24 on the top surface of the conductive structures 22 transnature, and the transnatured portion of the first dielectric layer 24 is denoted as 24a in FIG. 2B. The first dielectric layer 24 on each side-wall of the conductive structures 22 and on the substrate 20 between the conductive structures 22 is substantially not transnatured from the high implanting angle.

Figure 2C:
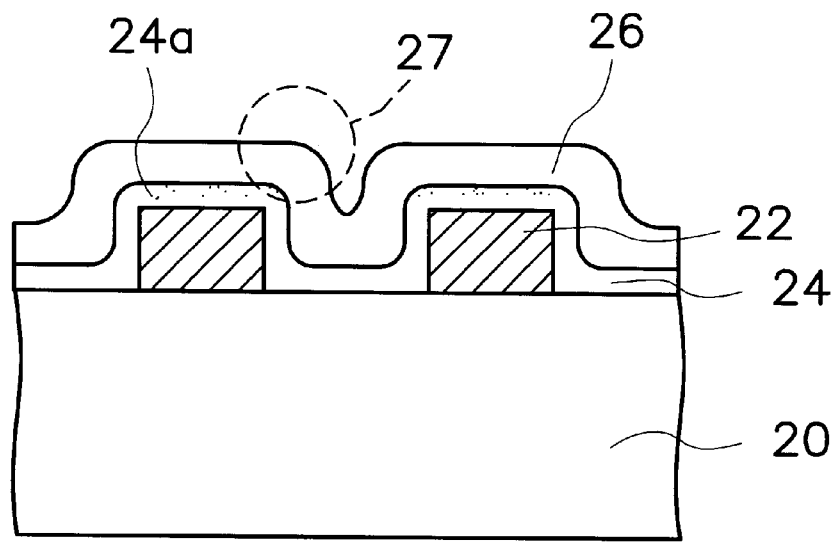
Figure 2D:
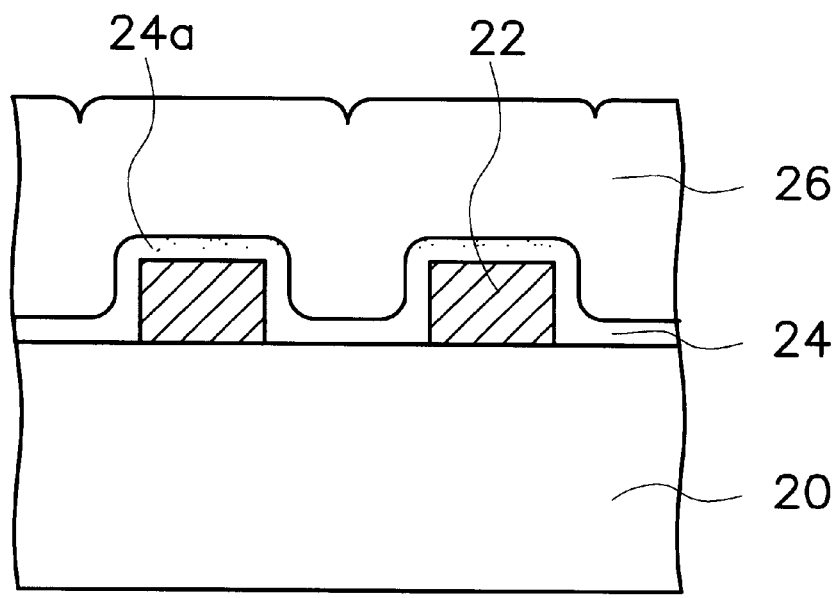

In FIG. 2C, a second dielectric layer 26 is formed on the original first dielectric layer 24 and on the transnatured first dielectric layer 24a. A preferred material of the second dielectric layer 26 comprises silicon dioxide, which is formed by, for example, PECVD. The transnatured first dielectric layer 24a and the original first dielectric layer 24 have different characteristics. The original first dielectric layer 24 has the same characteristics with the second dielectric layer 26 so that the second dielectric layer 26 deposition rate on the transnatured first dielectric layer 24a is slower than the second dielectric layer 26 deposition rate on the original first dielectric layer 24. Overhangs are thus not formed on an upper part 27 of the side wall of each the conductive structures 22 so that voids are not formed in the second dielectric layer 26 between the conductive structures 22. The second dielectric layer 26 is continually deposited until the gap between the conductive structures 22 is filled as shown in FIG. 2D.

The invention provides a method of gap filling. The high-angle implanting process is performed after forming the first dielectric layer. The first dielectric layer positioned above the conductive structures is thus transnatured. While depositing the second dielectric layer, overhangs are not formed on the upper part of the side wall of each the conductive structures. The gap between the conductive structures is filled without void.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of gap filling, comprising the steps of:
   providing a substrate having a plurality of conductive structures formed thereon;
   forming a conformal first dielectric layer directly on the substrate and the conductive structures;
   performing a high angle implanting process on the first dielectric layer to transnature a part of the first dielectric layer above a top surface of the conductive structures; and
   forming a second dielectric layer on the first dielectric layer.

2. The method according to claim 1, wherein a material of the first dielectric layer comprises undoped silicon dioxide.

3. The method according to claim 1, wherein the first dielectric layer is formed by atmospheric pressure chemical vapor deposition or plasma enhanced chemical vapor deposition.

4. The method according to claim 1, wherein the implanting process is performed with a high angle of about 40–80 degree.

5. The method according to claim 1, wherein a gas source used in the implanting process comprises nitrogen or ammonia.

6. The method according to claim 1, wherein a material of the second dielectric layer comprises silicon dioxide.

7. The method according to claim 1, wherein the second dielectric layer is formed by plasma enhanced chemical vapor deposition.

8. A method of filling gaps between a plurality of conductive structures formed on a substrate, comprising the steps of:
   forming a conformal first dielectric layer on and adjacent to the conductive structures;
   performing an implanting process with a predetermined angle on the first dielectric layer to transnature a part of the first dielectric layer above the conductive structures; and
   forming a second dielectric layer on the first dielectric layer to fill the gaps.

9. The method according to claim 8, wherein a material of the first dielectric layer comprises undoped silicon dioxide.

10. The method according to claim 8, wherein the first dielectric layer is formed by atmospheric pressure chemical vapor deposition or plasma enhanced chemical vapor deposition.

11. The method according to claim 8, wherein the predetermined angle is about 40–80 degree.

12. The method according to claim 8, wherein a gas source used in the implanting process comprises nitrogen or ammonia.

13. The method according to claim 8, wherein a material of the second dielectric layer comprises silicon dioxide.

14. The method according to claim 8, wherein the second dielectric layer is formed by plasma enhanced chemical vapor deposition.

15. The method according to claim 4, wherein the high angle is about 70 degree.

16. The method according to claim 11, wherein predetermined angle is about 70 degree.

* * * * *